United States Patent
Thaller et al.

(10) Patent No.: US 11,489,538 B2
(45) Date of Patent: Nov. 1, 2022

(54) ANALOG-TO-DIGITAL CONVERSION

(71) Applicant: Intel Corporation, Santa Clara, CA (US)

(72) Inventors: Edwin Thaller, Villach (AT); Christian Lindholm, Villach (AT)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 17/054,855

(22) PCT Filed: Sep. 28, 2018

(86) PCT No.: PCT/US2018/053469
§ 371 (c)(1),
(2) Date: Nov. 12, 2020

(87) PCT Pub. No.: WO2020/068123
PCT Pub. Date: Apr. 2, 2020

(65) Prior Publication Data
US 2021/0218410 A1  Jul. 15, 2021

(51) Int. Cl.
*H03M 1/00* (2006.01)
*H03M 1/12* (2006.01)

(52) U.S. Cl.
CPC ........... *H03M 1/121* (2013.01); *H03M 1/128* (2013.01)

(58) Field of Classification Search
CPC ..... H03M 1/121; H03M 1/128; H03M 1/1245
USPC ................................................. 341/122, 155
See application file for complete search history.

(56) References Cited

U.S. PATENT DOCUMENTS

| | | | |
|---|---|---|---|
| 5,168,276 A | 12/1992 | Huston et al. | |
| 6,356,220 B1 | 3/2002 | Takatsu | |
| 6,392,575 B1 * | 5/2002 | Eklund | H03M 1/0673 341/118 |
| 11,115,040 B1 * | 9/2021 | Xu | H03M 1/1215 |
| 2001/0052864 A1 | 12/2001 | Shimizu et al. | |
| 2003/0174082 A1 | 9/2003 | Honda | |
| 2003/0201927 A1 | 10/2003 | Watanabe et al. | |
| 2005/0068217 A1 | 3/2005 | Tsujita | |

(Continued)

FOREIGN PATENT DOCUMENTS

WO  2018006972 A1  1/2018

OTHER PUBLICATIONS

International Searching Authority, PCT Search Report issued for PCT/US2018/053469, 2 pgs., dated Dec. 7, 2018.
Jun. 2, 2022 (EP) Extended Search Report—App PCT/US2018/053469.

*Primary Examiner* — Peguy Jean Pierre
(74) *Attorney, Agent, or Firm* — Banner & Witcoff Ltd.

(57) ABSTRACT

A circuit having an array of Analog-to-Digital Converters (ADCs); a sampling order selector configured to select a sampling order of the ADCs and output corresponding sampling order control words; sampling pulse generators coupled between the sampling order selector and the respective ADCs, and configured to output respective sampling pulses based on the respective sampling order control words, wherein the ADCs are configured to sample and convert analog data into digital data in response to the sampling pulses; and a single clock generator configured to distribute a delay-matched clock to each of the ADCs in parallel, to each of the sampling pulse generators in parallel, and to the sampling order selector.

26 Claims, 4 Drawing Sheets

(56) References Cited

U.S. PATENT DOCUMENTS

| | | |
|---|---|---|
| 2008/0018502 A1 | 1/2008 | Wegener |
| 2009/0237281 A1 | 9/2009 | Dosho et al. |
| 2010/0153041 A1 | 6/2010 | Doris |
| 2015/0381195 A1* | 12/2015 | Sundblad .............. H03M 1/126 341/123 |
| 2018/0138919 A1* | 5/2018 | Björk .................. H03M 1/1038 |
| 2021/0281271 A1* | 9/2021 | Bales .................. H03M 1/1215 |

* cited by examiner

ANALOG-TO-DIGITAL CONVERSION

BACKGROUND

An Analog-to-Digital Converter (ADC) array is configured to convert analog data into digital data. Conventional ADC arrays route a plurality of evenly distributed clock phases to the individual ADCs, initiating time-interleaved sampling and conversion. The sampling clock for the individual ADCs is generated with a delay chain or a central Delay Locked Loop (DLL), and the individual sampling clock phases are distributed to the individual ADCs. These conventional ADC arrays suffer from delay buffer mismatch, clock routing mismatch, high routing for the large number of delay matched clock lines, and scrambling difficulties.

DESCRIPTION OF THE ASPECTS

The present disclosure is directed to a circuit comprising an Analog-to-Digital Converter (ADC) array having a single clock distributed to all ADCs in parallel such that clock phase generation for sampling is performed locally at the ADCs in a digital manner. The sampling phase is on-the-fly individually programmable for each ADC, thereby enabling scrambling of the ADCs.

Figure 1:
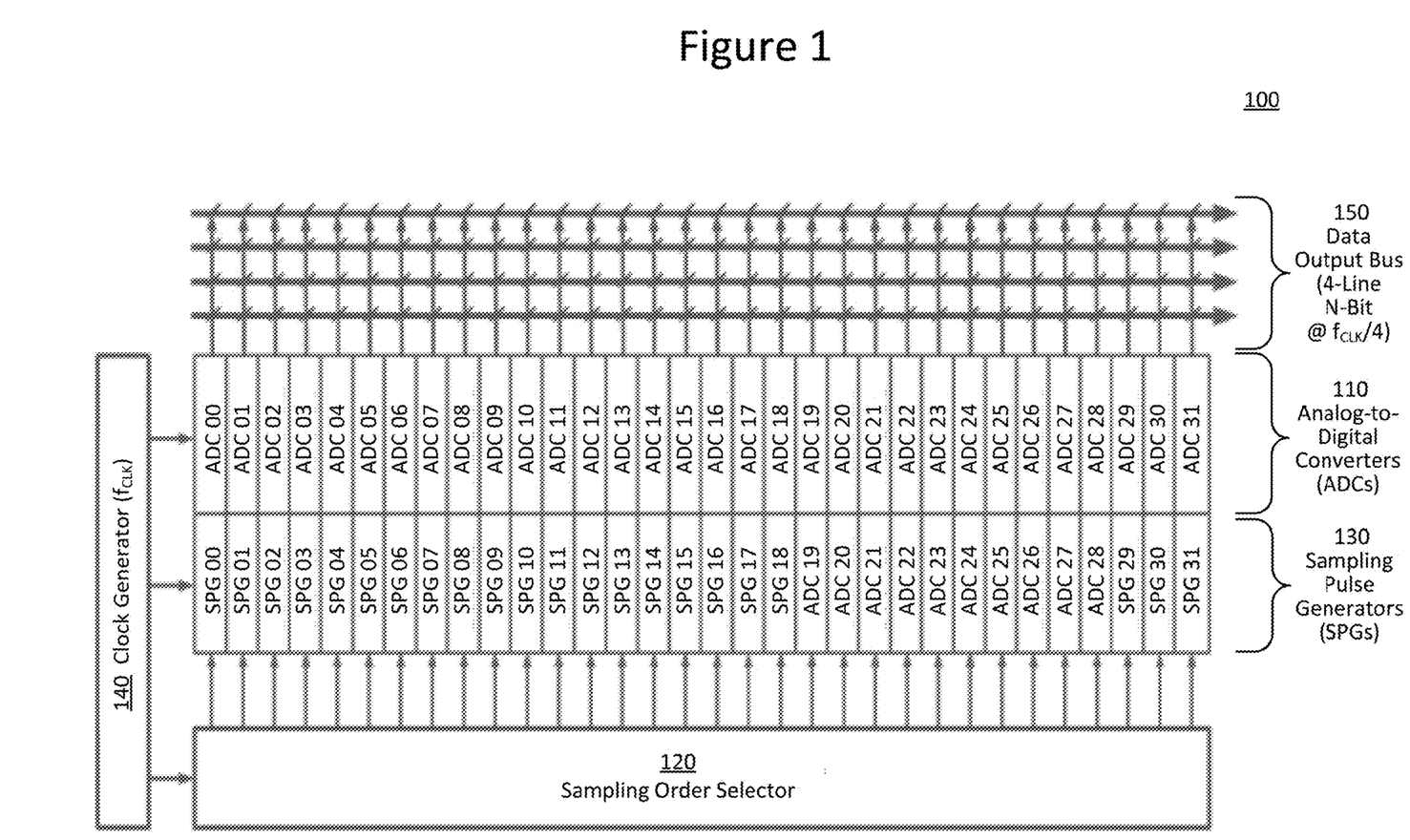
FIG. 1 illustrates a circuit in accordance with aspects of the disclosure.

FIG. 1 illustrates a circuit 100 in accordance with aspects of the disclosure.

The circuit 100 comprises an array of Analog-to-Digital Converters (ADCs) 110, a sampling order selector 120, Sampling Pulse Generators (SPGs) 130, a single clock generator 140, and a digital data output bus 150.

The array of ADCs has, in this example, 32 ADCs (ADC 00 ... ADC 31) 110, each having N-bits. It is understood that this disclosure is not limited to an array of 32 ADCs 110 each having N-bits. The array may have M identical ADCs 110, M being an integer, each ADC 110 having N bits, N being an integer.

The sampling order selector 120 is configured to select a sampling order of the ADCs 110, and output corresponding sampling order control words. The sampling order selector 120 is configured to, for each ADC array conversion cycle, select ADCs 110 of the array for conversion, and output the respective sampling order control words for the respective selected ADCs 110. Non-selected ADCs 110 are redundant for the ADC array conversion cycle.

The sampling order selector 120 is configured to select the sampling order randomly or on-the-fly. The sampling order selector 120 may select one or more of the ADCs 110 as redundant, and change the selected one or more non-selected redundant ADCs 110 for each ADC array conversion cycle. The sampling order selector 120 may be further configured to exclude one or more of the plurality of ADCs from selection. The non-selected ADCs 110 are not redundant (i.e., inactive, idle, or spare) because they are not functioning properly. Rather, for each ADC conversion cycle some of the ADCs 110 are selected to be redundant, and the order of the selected ADCs 110 is changed in order to average noise and reduce spurs that would occur by maintaining a sampling and conversion order.

The SPGs 130 are coupled between the sampling order selector 120 and the respective ADCs 110, and are configured to output respective sampling pulses based on the respective sampling order control words. There is a SPG 130 (SPG 00 ... SPG 31) corresponding to each ADC 110 (ADC 00 ... ADC 31). Each of the SPGs 130 may be or may comprise a counter (not shown) configured to transmit the respective sampling pulse on overflow or underflow or equality of a predefined counter value (i.e., corresponding with the respective sampling order control word), which was selected and output by the sampling order selector 120, in order to initiate a sampling and conversion start of the corresponding ADC 110.

The ADCs 110 are configured to sample and convert analog data into digital data in response to receiving the respecting sampling pulses. The ADCs 110 comprise respective digital outputs coupled to the digital data output bus 150.

The digital data output bus 150 may comprise a single bus line. Alternatively, the digital data output bus 150 may comprise K parallel bus lines, with each of the ADCs 110 coupled to each of the parallel bus lines, K being an integer. With K parallel bus lines, K of the ADCs 110 are configured to sample and convert the analog data into the digital data consecutively, and output the digital data to the K bus lines simultaneously in an order corresponding with the sampling order control words such that the digital data order on the bus lines corresponds with the sampling and conversion order. This is a form of demultiplexing. Each ADC 110 selectively sends a particular conversion result to only one of the bus lines. Also, the digital data may be output to the digital data output bus 150 along with corresponding indexes of the ADCs 110.

Digital data is output by an ADC 110 to the digital data bus 150 a certain number of clock cycles after conversion. The bus line of the digital data bus 150 to which the digital data is output and the number of clock cycles depends on the control word/counter value and defined such that K ADCs 110 which sample consecutively, output digital data on the digital data output bus 150 simultaneously, resulting in an output rate of $f_{CLK}/K$. From the data output bus 150, the digital output data may be written in parallel from the bus lines to a memory or to a digital front end for further processing.

The single clock generator 140 is configured to distribute a delay-matched clock $f_{CLK}$ to each of the ADCs 110 in parallel, to each of the sampling pulse generators 130 in parallel, and to the sampling order selector 120. This high frequency sampling/conversion clock $f_{CLK}$ may be coupled to the ADCs 110, SPGs 130, and the sampling order selector 120 over a matched clock-tree.

A time-interleaved ADC converter array comprises a plurality of identical ADCs 110 to achieve a sampling rate that is higher than a sampling rate of an individual ADC 110. A detailed example follows, wherein the variables are defined as: $f_{CLK}$=clock; $f_{SADC}$=sampling rate of individual ADC 110; $f_{SP}$=sampling rate of P parallel ADCs 110; $f_S$=sampling rate of the ADC array; N=ADC bit width, and bit width of each data output bus line; M=number of ADCs 110; P=number of parallel ADCs 110 which are active; C=number of $f_{CLK}$ cycles required by each ADC 100 to perform one conversion; K=number of data output bus lines; and S=number of redundant (i.e., inactive, idle, or spare) ADCs 110.

For an ADC 110 operating at clock frequency $f_{CLK}$ and taking C clock cycles for a complete conversion, the maximum sampling rate is $f_{SADC}=f_{CLK}/C$. By time interleaving a plurality of ADCs (P) 110, the sampling rate can be increased to $f_{SP}=P*f_{CLK}/C$. If the number of parallel time-interleaved ADCs (P) 110 is chosen to be C, the sampling rate becomes $f_{SP}=f_{CLK}$.

The converter array disclosed herein comprises M parallel ADCs 110, each requiring C cycles for a conversion, with M>C. The time interval for interleaving is $1/f_{CLK}$. So if C ADCs 110 are interleaved and working in parallel, a sampling rate of $f_S=f_{CLK}$ is achieved. The remaining S=M−C ADCs 110 of the array are redundant and can be used for scrambling. So as an example, when there are M=32 ADCs 110, each requiring C=24 clock cycles for one conversion, there are eight redundant ADCs 110 that can be used for scrambling.

If the counter is a down-counter, clocked with clock $f_{CLK}$, a new sample and conversion is triggered by the counter outputting a trigger pulse to the respective ADC 110 when the counter value becomes 0. At the end of every conversion the counter is reloaded with a new value from a reload register of the sampling order selector 120. The sampling order selector 120 generates the reload values for the counters in a way that C ADCs 110 are operating in parallel and conversion is initiated in a consecutive manner. The algorithm by which the sampling order selector 120 scrambles the ADCs 110 is not limited. Also, individual ADCs 110 may be completely excluded, for example, for background calibration. Further, operation of the array could be limited to only C out of the M ADCs 110.

If a sampling rate lower than clock $f_{CLK}$ is desired, the number of ADCs 110 working in parallel can be reduced to P=C/n as long as the resulting number is an integer for achieving an equidistant sampling interval of the ADCs 110, where each of n and P is an integer. For example, if there are 24 ADCs 110 converting consecutively at a full clock rate $f_{CLK}$, then n=1 and P=24/1=24. If a sampling rate of $f_{CLK}/2$ is desired, there should be 12 ADCs 110 which consecutively start sampling and converting only every other clock cycle, and in this example n=2. On the other hand, if a sampling rate of $f_{CLK}/3$ is desired, there should be 8 ADCs 110 which consecutively start sampling and converting only every third clock cycle, and in this example n=3. Thus all the possible integers n for C=24 are 1, 2, 3, 4, 6, 8, 12, 24, with integers for P being 24, 12, 8, 6, 4, 3, 2, 1.

In a simple implementation, the digital data output from all of the ADCs 110 of the array could be coupled to a Digital Signal Processor (DSP) for further processing via a parallel digital data output bus lines to result in a wide data bus having M*N lines. For each clock cycle $f_{CLK}$, one ADC 110 begins a conversion while another ADC 110 outputs converted digital data. If there are 32 parallel bus lines, it is possible to either wait 32 clock cycles for all of the 32 output bus line to have digital data and capture all of this digital data at once, or alternatively, for each clock cycle $f_{CLK}$ read digital data off of a single output bus line so that there is less digital data read in a clock cycle $f_{CLK}$, or alternatively some variable in between.

To reduce the number of digital output signals, the data output bus 150 may comprise K parallel digital output buses 150, each having N bus lines. This reduces the number of digital output signals to K*N, with the resulting data rate being $f_{CLK}/K$. There is a tradeoff between the number of parallel data output bus lines to increase data rate, and the area required to route all of the data output bus lines.

Figure 2:
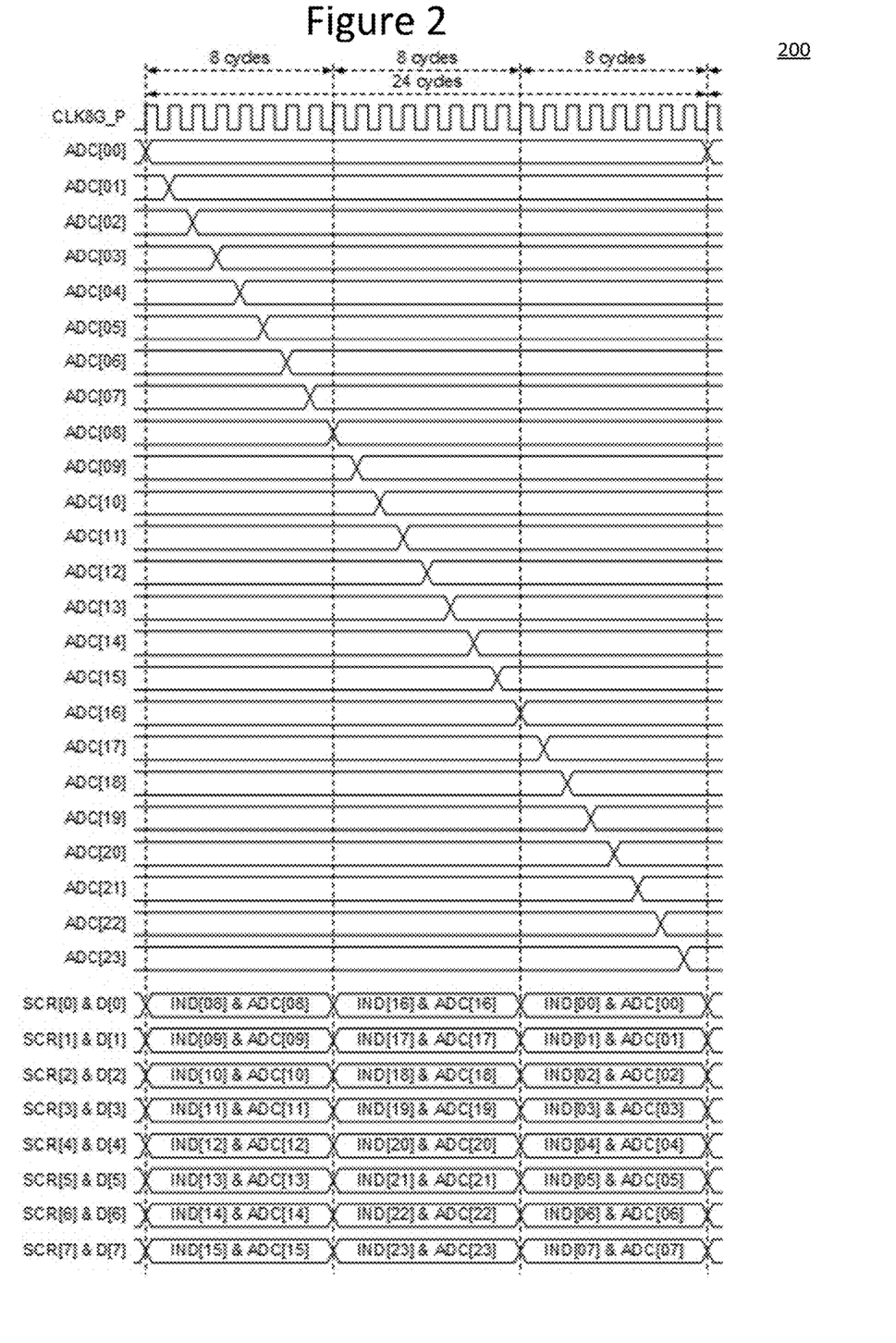
FIG. 2 illustrates an exemplary timing diagram in accordance with aspects of the disclosure.

FIG. 2 illustrates an exemplary timing diagram 200 in accordance with aspects of the disclosure.

The timing diagram 200 is for an array of 32 ADCs and a data output bus having eight parallel bus lines (as opposed to the four bus lines of FIG. 1). Of the 32 ADCs in the array, 24 ADCs are active, and eight ADCs are redundant (i.e., inactive, idle, or spare). "ADC[00]" to "ADC[23]" represent the 24 active ADCs. An array conversion cycle is thus 24 clock cycles where "CLK8G _P" represents the clock cycles. A conversion result of eight ADCs is available on the eight bus lines every eight clock cycles $f_{CLK}$. The resulting data rate on the data output bus is thus $f_{CLK}/8$.

"SCR[0] & D[0]" to "SCR[7] & D[7]" represent the data output bus lines, with SCR[#] representing a sampling index (i.e., sampling order control word or counter value) and D[#] representing the corresponding data. In this example there are eight parallel data output bus lines (K=8). If there is an ADC array of 23 ADCs having 10-bit data output, and indexing of each ADC requires 5 bits, then each bus line of the data output bus requires 5+10=15 bits.

Figure 3:
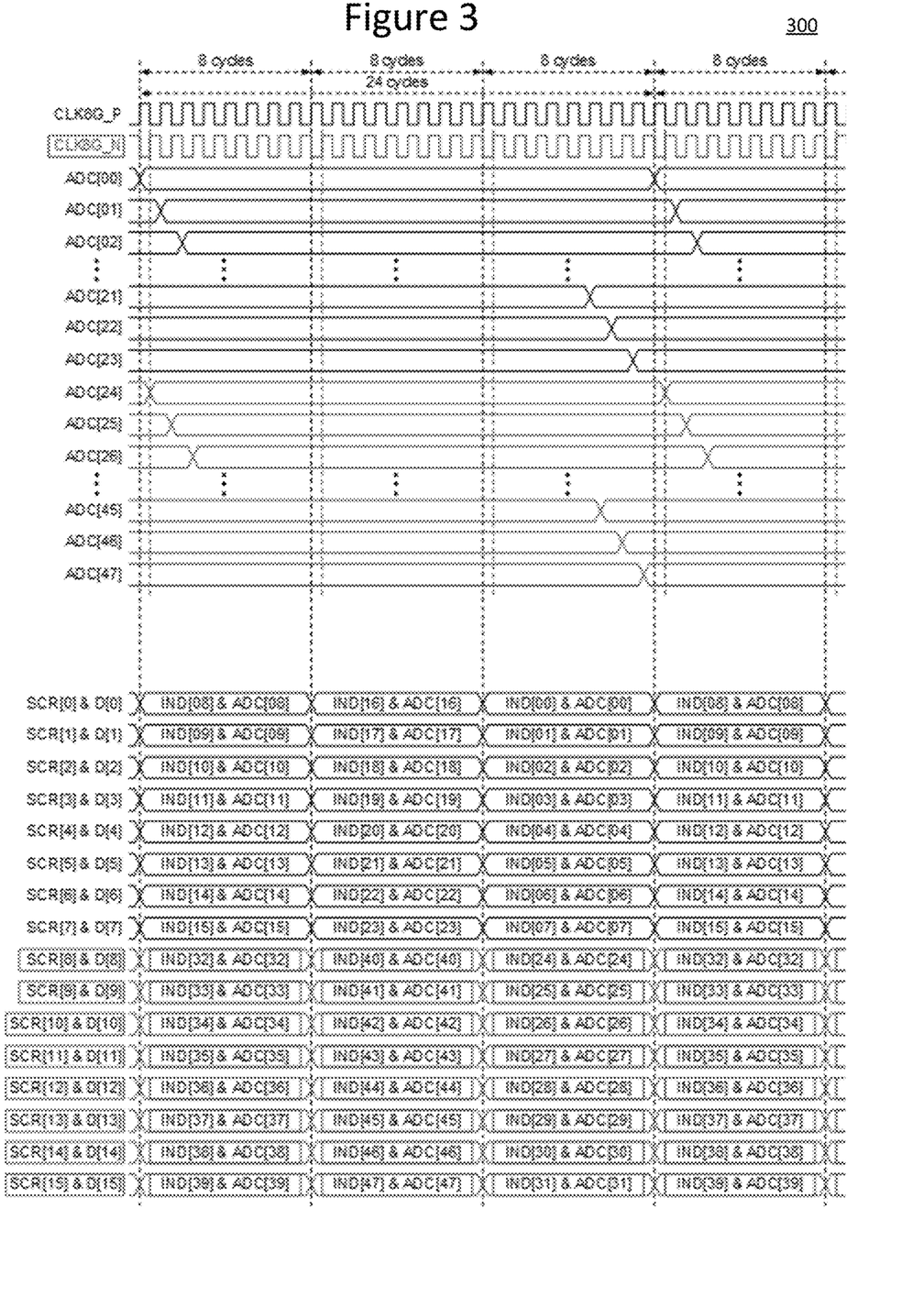
FIG. 3 illustrates another exemplary timing diagram in accordance with aspects of the disclosure.

FIG. 3 illustrates another exemplary timing diagram 300 in accordance with aspects of the disclosure.

The timing diagram 300 is for an array of 64 ADCs and a data output bus having 16 parallel bus lines (as opposed to the four bus lines of FIG. 1). Of the 64 ADCs in the array, 48 ADCs are active, and 16 ADCs are redundant (i.e., inactive, idle, or spare). "ADC[00]" to "ADC[47]" represent the 48 active ADCs. "CLK8G_P" represents the clock cycles. A conversion result of eight ADCs is available on the eight bus lines every eight clock cycles $f_{CLK}$. The resulting data rate on the data output bus is thus $f_{CLK}/8$.

"SCR[0] & D[0]" to "SCR[15] & D[15]" represent the data output bus lines, with SCR[#] representing a sampling index and D[#] representing the corresponding data. In this example there are 16 parallel data output bus lines (K=16). Alternatively, it is possible to have eight bus lines and then double the data rate from $f_{CLK}/8$ to $f_{CLK}/4$, so the data is updated every four cycles in the timing diagram instead of every eight cycles as shown.

This 64-ADC array example is comprised of two 32-ADC sub-arrays. One of the two 32-ADC sub-arrays (ADC[00] . . . ADC[31]) is clocked on a rising edge of a positive clock CLK8G_P, and the other 32-ADC sub-array (ADC[32] . . . ADC[63]) is clocked on a rising edge of the inverted clock CLK8G_N. The dotted vertical lines show the alignment with clock edges. It is appreciated that the disclosure is not limited to the one sub-array being clocked on the rising edge and the other sub-array being clocked on the falling edge. For example, both sub-arrays could be clocked with $2*f_{CLK}$ frequency on a same edge.

Figure 4:
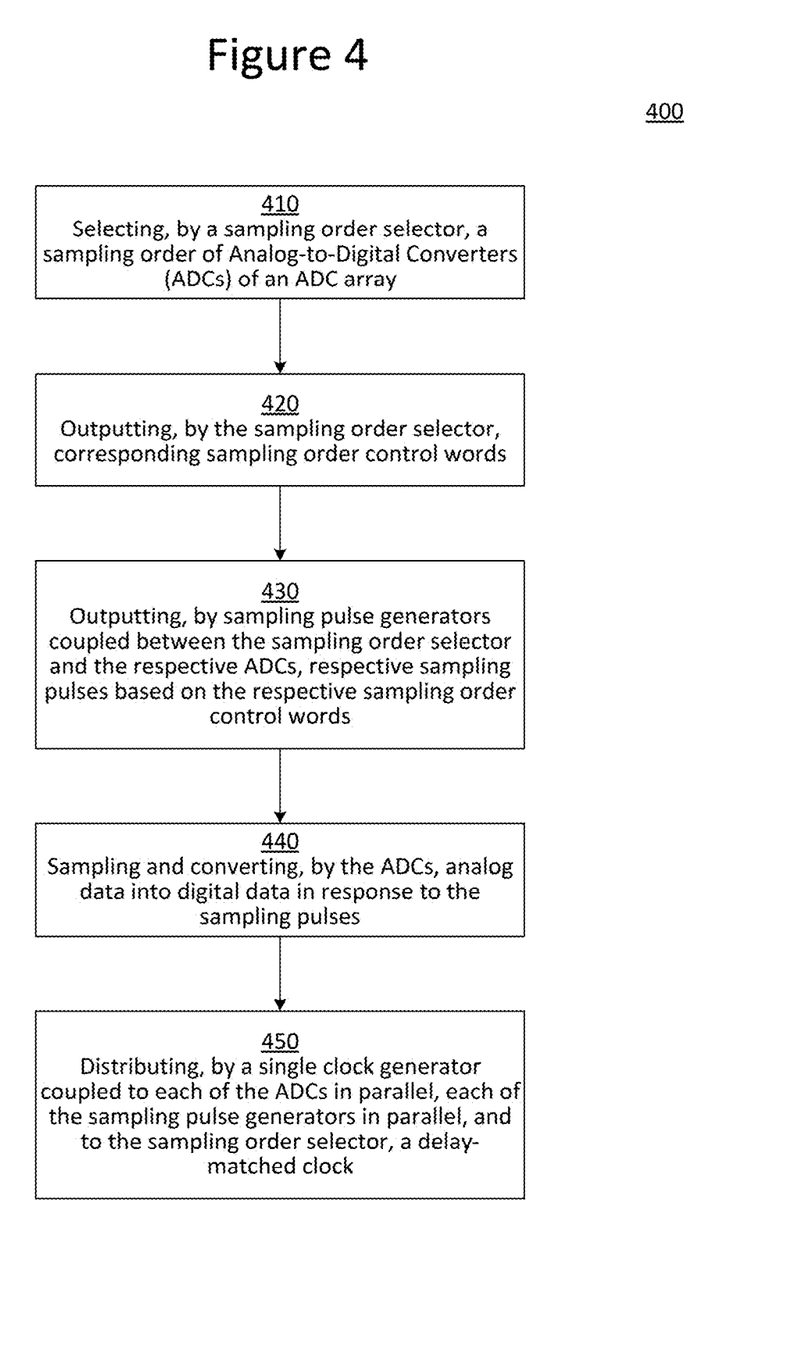
FIG. 4 illustrates a flowchart of a method in accordance with aspects of the disclosure.

FIG. 4 illustrates a flowchart 400 of a method in accordance with aspects of the disclosure.

At Step 410, a sampling order selector 120 selects a sampling order of Analog-to-Digital Converters (ADCs) 110 of an ADC array.

At Step 420, the sampling order selector 120 outputs corresponding sampling order control words.

At Step 430, sampling pulse generators 130, which are coupled between the sampling order selector 120 and the respective ADCs 110, output respective sampling pulses based on the respective sampling order control words.

At Step 440, the ADCs 110 sample and convert analog data into digital data in response to the sampling pulses.

At Step 450, a single clock generator 140, which is coupled to each of the ADCs 110 in parallel, each of the sampling pulse generators 130 in parallel, and to the sampling order selector 120, distributes a delay-matched clock.

The subject matter described herein is advantageous over previous solutions in numerous respects. There is a distribution of only one delay-matched high speed clock to all ADCs 110 such that generation/distribution of clock phases is not required. The ADCs 110 may be easily scrambled to sample and convert in a random order. There is also high-speed data demultiplexing at the ADC output with a selectable data output bus width and data rate.

The following examples pertain to further aspects.

Example 1 is a circuit, comprising: an array of Analog-to-Digital Converters (ADCs); a sampling order selector configured to select a sampling order of the ADCs and output corresponding sampling order control words; sampling pulse generators coupled between the sampling order selector and the respective ADCs, and configured to output respective sampling pulses based on the respective sampling order control words, wherein the ADCs are configured to sample and convert analog data into digital data in response to the sampling pulses; and a single clock generator configured to distribute a delay-matched clock to each of the ADCs in parallel, to each of the sampling pulse generators in parallel, and to the sampling order selector.

In Example 2, the subject matter of Example 1, wherein each of the sampling pulse generators comprises a counter configured to transmit the respective sampling pulse on overflow or underflow or equality of a predefined counter value corresponding with the respective sampling order control word.

In Example 3, the subject matter of Example 1, wherein the sampling order selector is configured to, for each ADC array conversion cycle, select ADCs of the array of ADCs for conversion with the non-selected ADCs being redundant, and output the respective sampling order control words for the respective selected ADCs.

In Example 4, the subject matter of Example 3, wherein the sampling order selector is configured to select the ADCs and the sampling order of the selected ADCs randomly.

In Example 5, the subject matter of Example 1, wherein the sampling order selector is configured to select the sampling order randomly.

In Example 6, the subject matter of Example 1, wherein the sampling order selector is configured to select the sampling order on-the-fly.

In Example 7, the subject matter of Example 1, wherein the ADCs comprise respective digital outputs coupled to a digital data output bus.

In Example 8, the subject matter of Example 7, wherein the digital data output bus comprises a single bus line.

In Example 9, the subject matter of Example 7, wherein the digital data output bus comprises K parallel bus lines, with each of the ADCs coupled to each of the parallel bus lines, K being an integer.

In Example 10, the subject matter of Example 9, wherein K of the ADCs are configured to sample and convert the analog data into the digital data consecutively, and output the digital data to the K bus lines simultaneously in an order corresponding with the sampling order control words such that the digital data order on the bus lines corresponds with the sampling and conversion order.

In Example 11, the subject matter of Example 7, wherein the ADCs are configured to sample and convert the analog data into the digital data consecutively, and output to the digital data output bus the digital data and corresponding indexes of the ADCs.

In Example 12, the subject matter of Example 1, wherein the sampling order selector is configured to select one or more of the ADCs as redundant, and to change the selected one or more redundant ADCs for each ADC array conversion cycle.

In Example 13, the subject matter of Example 1, wherein the sampling order selector is configured to exclude one or more of the plurality of ADCs from selection.

Example 14 is a method, comprising: selecting, by a sampling order selector, a sampling order of Analog-to-Digital Converters (ADCs) of an ADC array; outputting, by the sampling order selector, corresponding sampling order control words; outputting, by sampling pulse generators coupled between the sampling order selector and the respective ADCs, respective sampling pulses based on the respective sampling order control words; sampling and converting, by the ADCs, analog data into digital data in response to the sampling pulses; and distributing, by a single clock generator, a delay-matched clock, wherein the single clock generator is coupled to each of the ADCs in parallel, each of the sampling pulse generators in parallel, and to the sampling order selector.

In Example 15, the subject matter of Example 14, wherein the sampling by the sampling order selector comprises: selecting, for each ADC array conversion cycle, ADCs of the array of ADCs for conversion with the non-selected ADCs being redundant; and outputting the respective sampling order control words for the respective selected ADCs.

In Example 16, the subject matter of Example 15, wherein the sampling by the sampling order selector comprises: selecting the ADCs and the sampling order of the selected ADCs randomly.

In Example 17, the subject matter of Example 14, wherein the sampling by the sampling order selector comprises: selecting the sampling order randomly.

In Example 18, the subject matter of Example 14, wherein the sampling by the sampling order selector comprises: selecting the sampling order on-the-fly.

In Example 19, the subject matter of Example 14, wherein: the ADCs comprise respective digital outputs coupled to a digital data output bus which comprises K parallel bus lines, and each of the ADCs is coupled to each of the parallel bus lines, and K is an integer, and the method further comprises: sampling and converting, by K of the ADCs, the analog data into the digital data consecutively, and outputting the digital data to the K bus lines simultaneously in an order corresponding with the sampling order control words such that the digital data order on the bus lines corresponds with the sampling and conversion order.

In Example 20, the subject matter of Example 19, wherein: the ADCs comprise respective digital outputs coupled to a digital data output bus; the method further comprises: sampling and converting the analog data into the digital data consecutively, and outputting to the digital data output bus the digital data and corresponding indexes of the ADCs.

Example 21 is a circuit, comprising: an array of Analog-to-Digital Converters (ADCs); a sampling order selecting means for selecting a sampling order of the ADCs and outputting corresponding sampling order control words; sampling pulse generating means coupled between the sampling order selecting means and the respective ADCs, for outputting respective sampling pulses based on the respective sampling order control words, wherein the ADCs are for sampling and converting analog data into digital data in response to the sampling pulses; and a single clock generating means for distributing a delay-matched clock to each of the ADCs in parallel, to each of the sampling pulse generators in parallel, and to the sampling order selector.

In Example 22, the subject matter of Example 21, wherein the sampling order selecting means is for, for each ADC array conversion cycle, selecting ADCs of the array of ADCs for conversion with the non-selected ADCs being redundant, and for outputting the respective sampling order control words for the respective selected ADCs.

In Example 23, the subject matter of Example 21, wherein the sampling order selecting means is for selecting one or more of the ADCs as redundant, and changing the selected one or more redundant ADCs for each ADC array conversion cycle.

While the foregoing has been described in conjunction with exemplary aspect, it is understood that the term "exemplary" is merely meant as an example, rather than the best or optimal. Accordingly, the disclosure is intended to cover alternatives, modifications and equivalents, which may be included within the scope of the disclosure.

Although specific aspects have been illustrated and described herein, it will be appreciated by those of ordinary skill in the art that a variety of alternate and/or equivalent implementations may be substituted for the specific aspects shown and described without departing from the scope of the present application. This application is intended to cover any adaptations or variations of the specific aspects discussed herein.

The invention claimed is:

1. A circuit, comprising:
   an array of Analog-to-Digital Converters (ADCs);
   a sampling order selector configured to select a sampling order of the ADCs and output corresponding sampling order control words;
   sampling pulse generators coupled between the sampling order selector and the respective ADCs, and configured to output respective sampling pulses based on the respective sampling order control words,
   wherein the ADCs are configured to sample and convert analog data into digital data in response to the sampling pulses; and
   a single clock generator configured to distribute a delay-matched clock to each of the ADCs in parallel, to each of the sampling pulse generators in parallel, and to the sampling order selector.

2. The circuit of claim 1, wherein each of the sampling pulse generators comprises a counter configured to transmit the respective sampling pulse on overflow or underflow or equality of a predefined counter value corresponding with the respective sampling order control word.

3. The circuit of claim 1, wherein the sampling order selector is configured to, for each ADC array conversion cycle, select ADCs of the array of ADCs for conversion with the non-selected ADCs being redundant, and output the respective sampling order control words for the respective selected ADCs.

4. The circuit of claim 3, wherein the sampling order selector is configured to select the ADCs and the sampling order of the selected ADCs randomly.

5. The circuit of claim 1, wherein the sampling order selector is configured to select the sampling order randomly.

6. The circuit of claim 1, wherein the sampling order selector is configured to select the sampling order on-the-fly.

7. The circuit of claim 1, wherein the ADCs comprise respective digital outputs coupled to a digital data output bus.

8. The circuit of claim 7, wherein the digital data output bus comprises a single bus line.

9. The circuit of claim 7, wherein the digital data output bus comprises K parallel bus lines, with each of the ADCs coupled to each of the parallel bus lines, K being an integer.

10. The circuit of claim 7, wherein K of the ADCs are configured to sample and convert the analog data into the digital data consecutively, and output the digital data to the K bus lines simultaneously in an order corresponding with the sampling order control words such that the digital data order on the bus lines corresponds with the sampling and conversion order.

11. The circuit of claim 7, wherein the ADCs are configured to sample and convert the analog data into the digital data consecutively, and output to the digital data output bus the digital data and corresponding indexes of the ADCs.

12. The circuit of claim 1, wherein the sampling order selector is configured to select one or more of the ADCs as redundant, and to change the selected one or more redundant ADCs for each ADC array conversion cycle.

13. The circuit of claim 1, wherein the sampling order selector is configured to exclude one or more of the plurality of ADCs from selection.

14. The circuit of claim 1, wherein the single clock generator is configured to distribute the delay-matched clock to each of the ADCs in parallel simultaneously, and to each of the sampling pulse generators in parallel simultaneously.

15. A method, comprising:
   selecting, by a sampling order selector, a sampling order of Analog-to-Digital Converters (ADCs) of an ADC array;
   outputting, by the sampling order selector, corresponding sampling order control words;
   outputting, by sampling pulse generators coupled between the sampling order selector and the respective ADCs, respective sampling pulses based on the respective sampling order control words;
   sampling and converting, by the ADCs, analog data into digital data in response to the sampling pulses; and
   distributing, by a single clock generator, a delay-matched clock, wherein the single clock generator is coupled to each of the ADCs in parallel, each of the sampling pulse generators in parallel, and to the sampling order selector.

16. The method of claim 15, wherein the sampling by the sampling order selector comprises:
   selecting, for each ADC array conversion cycle, ADCs of the array of ADCs for conversion with the non-selected ADCs being redundant; and
   outputting the respective sampling order control words for the respective selected ADCs.

17. The method of claim 16, wherein the sampling by the sampling order selector comprises:
   selecting the ADCs and the sampling order of the selected ADCs randomly.

18. The method of claim 15, wherein the sampling by the sampling order selector comprises:
   selecting the sampling order randomly.

19. The method of claim 15, wherein the sampling by the sampling order selector comprises:
   selecting the sampling order on-the-fly.

20. The method of claim 15, wherein:
   the ADCs comprise respective digital outputs coupled to a digital data output bus which comprises K parallel bus lines, and each of the ADCs is coupled to each of the parallel bus lines, and K is an integer, and
   the method further comprises:
   sampling and converting, by K of the ADCs, the analog data into the digital data consecutively, and outputting the digital data to the K bus lines simultaneously in an order corresponding with the sampling order control words such that the digital data order on the bus lines corresponds with the sampling and conversion order.

21. The circuit of claim 20, wherein:
the ADCs comprise respective digital outputs coupled to a digital data output bus;
the method further comprises:
sampling and converting the analog data into the digital data consecutively, and
outputting to the digital data output bus the digital data and corresponding indexes of the ADCs.

22. The method of claim 15, wherein the distributing comprises distributing, by the single clock generator, the delay-matched clock to each of the ADCs in parallel simultaneously, and to each of the sampling pulse generators in parallel simultaneously.

23. A circuit, comprising:
an array of Analog-to-Digital Converters (ADCs);
a sampling order selecting means for selecting a sampling order of the ADCs and outputting corresponding sampling order control words;
sampling pulse generating means coupled between the sampling order selecting means and the respective ADCs, for outputting respective sampling pulses based on the respective sampling order control words,
wherein the ADCs are for sampling and converting analog data into digital data in response to the sampling pulses; and
a single clock generating means for distributing a delay-matched clock to each of the ADCs in parallel, to each of the sampling pulse generators in parallel, and to the sampling order selector.

24. The circuit of claim 23, wherein the sampling order selecting means is for, for each ADC array conversion cycle, selecting ADCs of the array of ADCs for conversion with the non-selected ADCs being redundant, and for outputting the respective sampling order control words for the respective selected ADCs.

25. The method of claim 23, wherein the sampling order selecting means is for selecting one or more of the ADCs as redundant, and changing the selected one or more redundant ADCs for each ADC array conversion cycle.

26. The circuit of claim 23, wherein the single clock generating means is for distributing the delay-matched clock to each of the ADCs in parallel simultaneously, and to each of the sampling pulse generators in parallel simultaneously.

* * * * *